United States Patent [19]

Lowell et al.

[11] Patent Number: 4,995,411
[45] Date of Patent: Feb. 26, 1991

[54] MASS SOLDERING SYSTEM PROVIDING AN IMPROVED FLUID BLAST

[75] Inventors: Charles R. Lowell, Concord, Mass.; Janet R. Sterritt, Hollis, N.H.

[73] Assignee: Hollis Automation, Inc., Nashua, N.H.

[21] Appl. No.: 350,544

[22] Filed: May 11, 1989

Related U.S. Application Data

[63] Continuation-in-part of Ser. No. 254,712, Oct. 7, 1988, abandoned.

[51] Int. Cl.⁵ .............................. B08B 3/02
[52] U.S. Cl. .................... 134/198; 134/902; 228/20; 228/201; 239/590.3
[58] Field of Search ............ 239/590.3, 76, DIG. 21; 15/306 R, 306 A, 306 B; 134/198, 902; 228/19, 20, 201; 118/56; 427/348, 349

[56] References Cited

U.S. PATENT DOCUMENTS

| | | |
|---|---|---|
| 1,751,960 | 3/1930 | Veenstra ............... 239/590.3 |
| 1,987,962 | 1/1935 | Leupold ............... 239/590.3 |
| 3,304,038 | 2/1967 | Guthrie . |
| 3,500,536 | 3/1970 | Goldschmied ............ 228/20 |
| 3,724,418 | 4/1973 | McLain ................. 118/69 |
| 4,401,253 | 8/1983 | O'Rourke .............. 228/20 |
| 4,410,126 | 10/1983 | O'Rourke .............. 228/20 |
| 4,664,308 | 5/1987 | Boynton ............... 228/20 |
| 4,679,720 | 7/1987 | Sedrick, Jr. et al. ....... 228/20 |

FOREIGN PATENT DOCUMENTS

0219059  4/1987  European Pat. Off. .

*Primary Examiner*—Philip R. Coe
*Attorney, Agent, or Firm*—Hayes, Soloway Hennessey & Hage

[57] ABSTRACT

An improved hot air knife for use in removing excess solder from a circuit board in a mass soldering system of the type described in U.S. Pat. Nos. 4,410,126 and 4,401,253 is described. In the present invention the hot air knife comprises a commercially available square tube, one of whose edges has been cut to provide the air knife outlet. Inside this tube, there is provided a second round tube for introducing hot air into the space between the round tube and the square tube. This inner round tube has holes facing away from the outlet slit of the square tube, preferably at least 45 degrees on both sides of a plane extending from the outlet of the square tube to the opposite corner of the square tube. In a preferred embodiment of the invention there is also provided at least one baffle in the volume between the outlet holes from the inner tube and the outlet slot for the air knife. In a preferred invention, this baffle is in the form of a fairly fine screen (about 60 mesh) in the volume between the tube and the rear corner of the square tube. Another such wire mesh can be provided on the other side of the space between the round and square tubes.

The "air knife" can also be used as a high pressure water jet for cleaning surface mounted semiconductor elements carried by printed circuit boards.

1 Claim, 4 Drawing Sheets

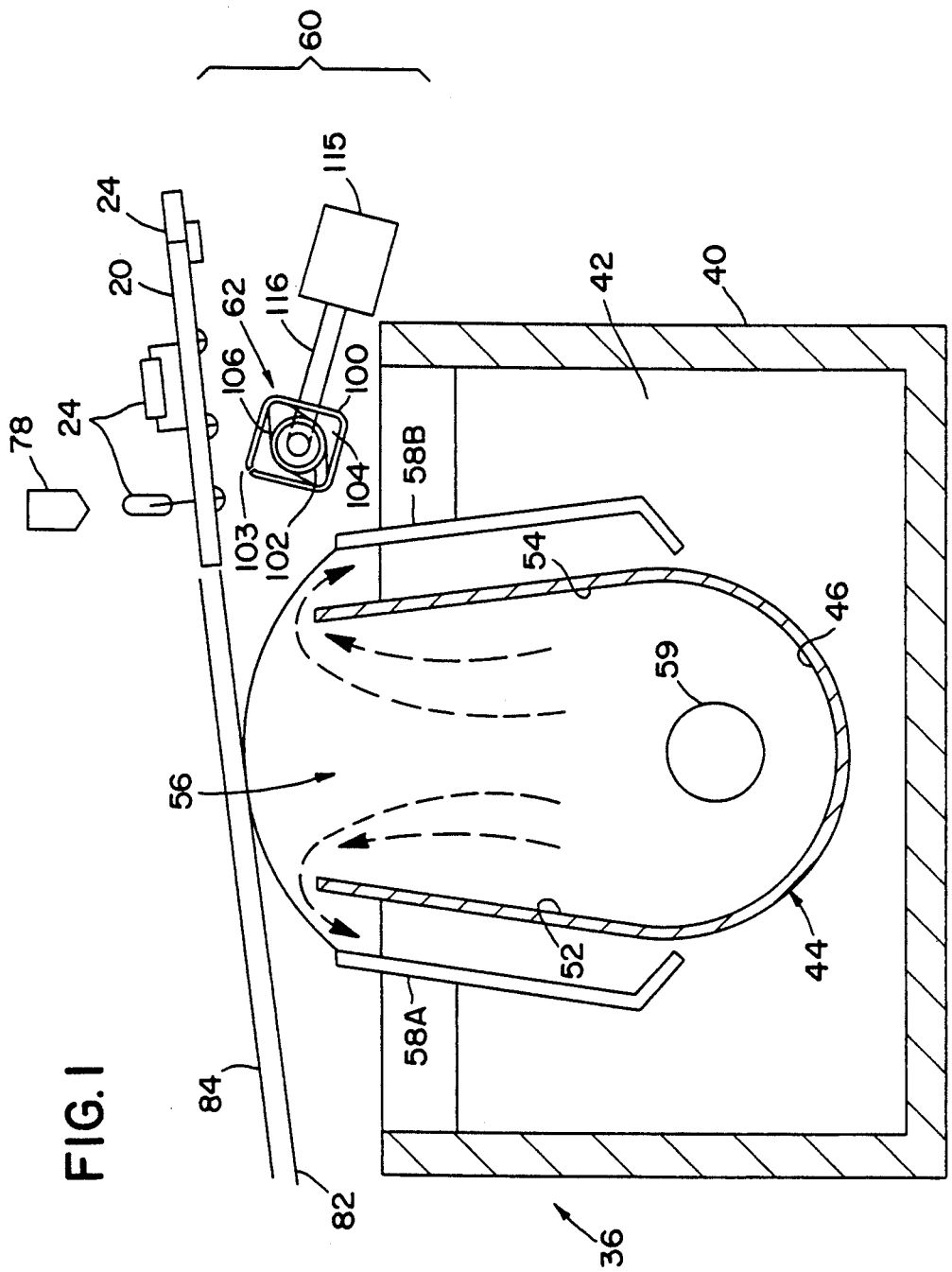

FIG. 3
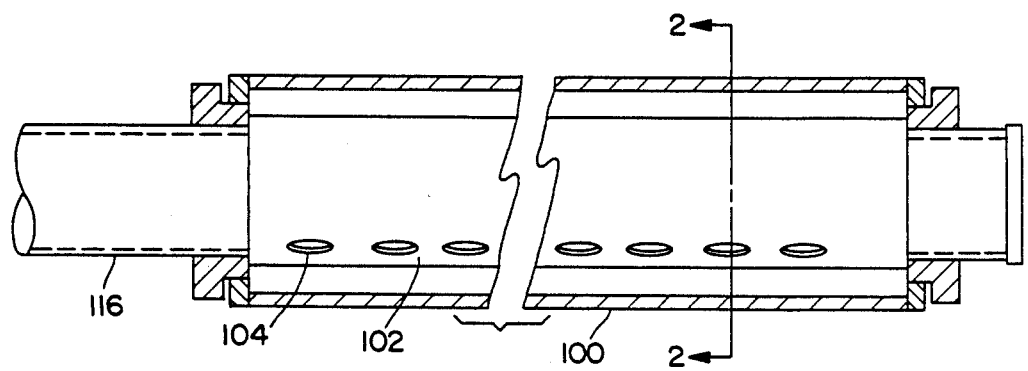
FIG. 2
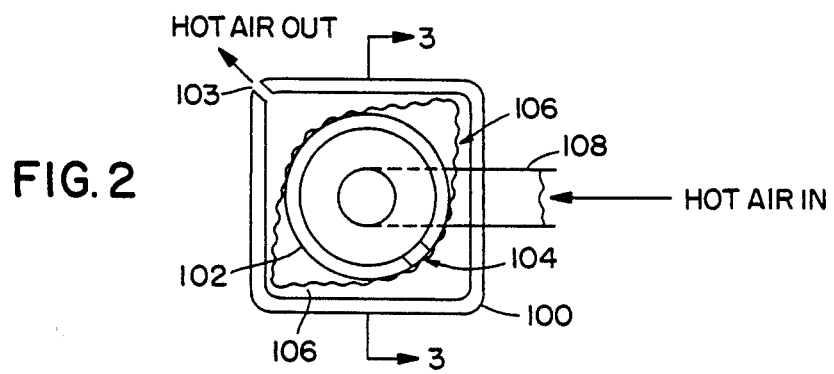
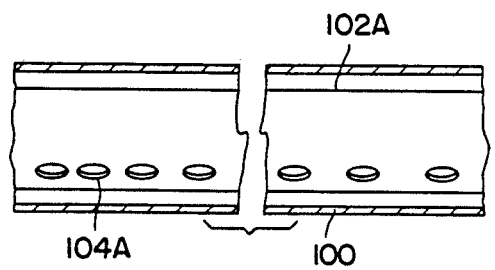
FIG. 3a

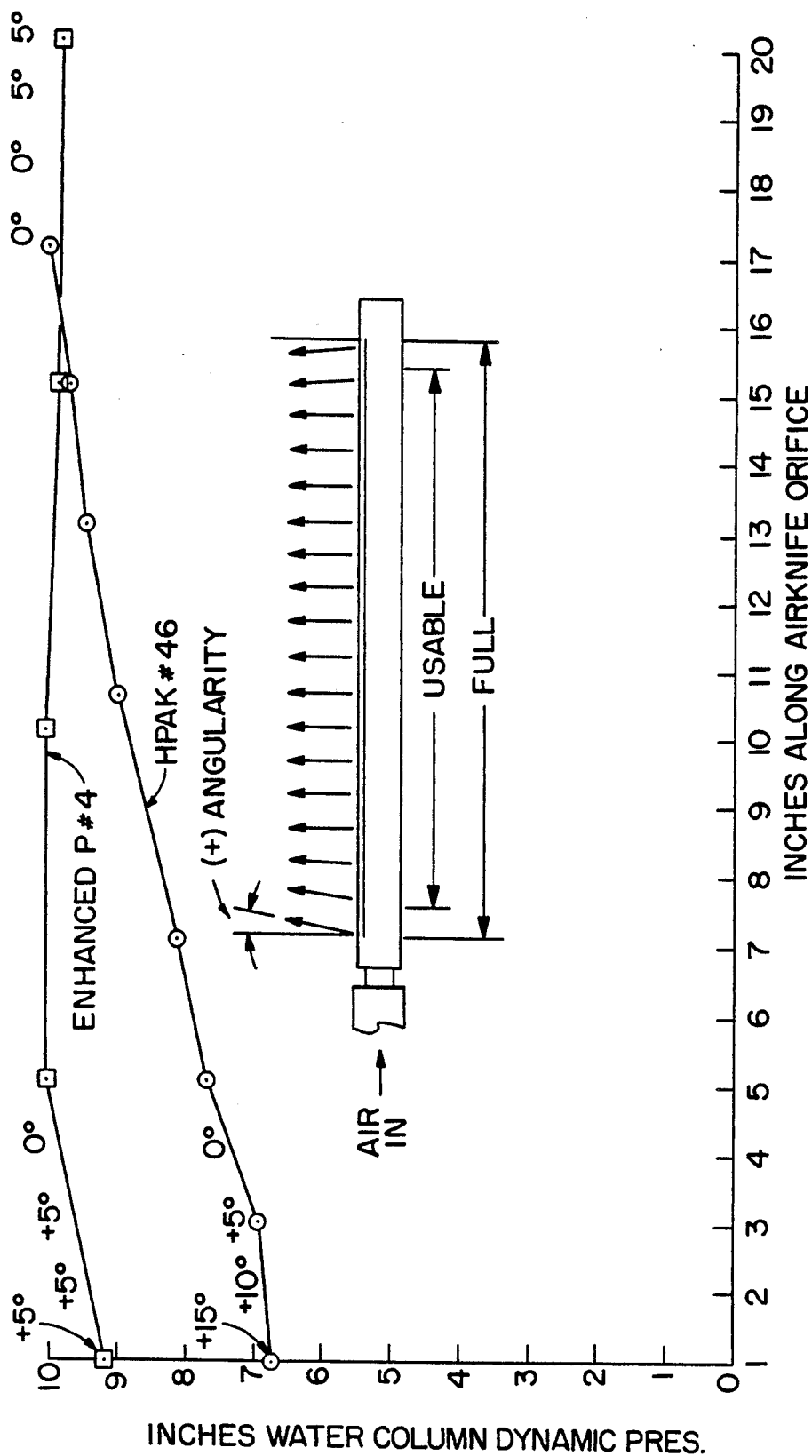

MASS SOLDERING SYSTEM PROVIDING AN IMPROVED FLUID BLAST

The present application is in part a continuation of our co-pending application Serial No. 254712 filed October 7, 1988, now abandoned.

BACKGROUND OF THE INVENTION

The present invention is directed to a fluid nozzle for providing a high velocity sheet of fluid of substantially uniform velocity, density and volume extending in a predetermined direction and arranged to impact a substrate to be treated by such sheet of fluid as the substrate is moved past the nozzle. In one form of the invention, it is directed to an improvement in a mass soldering system of the type described in the earlier patents of H.T. O'Rourke, U.S. Pat. Nos. 4410126 and 4401253. This prior patented system involves directing a hot air knife blast onto the bottom surface of a printed component-carrying circuit board, the air blast impinging on the surface immediately after the printed circuit board leaves a wave soldering system. The impinging air blast is reported to reduce the incidence of solder shorts, icicling and/or bridging, and has achieved widespread adoption.

In working with the previously patented system, various efforts have been made to improve the distribution of the air blast across the width of the path of travel of circuit boards through which the boards having the freshly deposited excess solder are passed for treatment by the air blast. In order to improve this uniformity, a modified tube construction has been suggested in the past to change the airflow characteristics. In one of these, a screen mesh baffle tube has been utilized inside of a round tube. While this has given some improvement, it has not given a substantially uniform flow of air across an orifice aimed at the solder to be removed.

In another form of the invention, the fluid knife is used as a cleaning system, particularly for removing soldering flux from surface mounted semiconductor components carried by printed circuit boards.

BRIEF SUMMARY OF THE PRESENT INVENTION

In the present invention, it has been found that a fluid nozzle for providing a high velocity sheet of fluid of substantially uniform velocity, density and volume extending in a predetermined direction can be created by utilizing a commercially available square tube, one of whose edges has been cut to provide a fluid nozzle outlet slit Inside this tube, there is provided a second round tube for introducing high pressure fluid (e.g., hot air) into the space between the round tube and the square tube. This inner round tube has holes facing away from the outlet slit of the square tube, at least 45 degree (preferably at least 90°) as measured from the slit, on either side of a plane extending from the outlet of the square tube to the opposite corner of the square tube. In one preferred embodiment of the invention (particularly when used as a hot air knife) there is also provided at least one baffle in the volume between the outlet holes from the inner tube and the outlet slot for the hot air knife. In this preferred invention, this baffle is in the form of a fairly fine screen (about 60 mesh) in the volume between the tube and the rear corner of the square tube. Another such wire mesh can be provided on the other side of the space between the round and square tubes.

In other respects, the invention (when used as a hot air knife) is similar to the structure shown in U.S. Pat. Nos. 4410126 and 4401253, these patents being assigned to predecessors of the owner of the present patent application. The disclosures of both these two patents are incorporated herein in their entirety.

DETAILED DESCRIPTION OF THE INVENTION

A preferred form of the invention, for use as a hot air knife, will be described as an improvement over the earlier O'Rourke patents Nos. 4401126 and 4401253. For a fuller understanding of the present invention, reference should be had to the following detailed description taken in connection with accompanying drawings in which;

FIG. 1 is a side elevational view partly in section of one form of soldering apparatus made in accordance with the present invention which provides a uniform air blast which impinges on the underside of the circuit board as it leaves the solder wave, FIG. 2 is an enlarged sectional view of the nozzle of FIG. 1;

FIG. 3 is a top plan view, partly in section, of the nozzle of FIG. 2;

FIG. 3A is a view of a portion of FIG. 3 showing a modified arrangement of holes.

FIG. 4 is a graph showing air distribution from the nozzle of the present invention as compared to the best prior art nozzle previously made and sold by the company owning the present invention.

Figure 5:
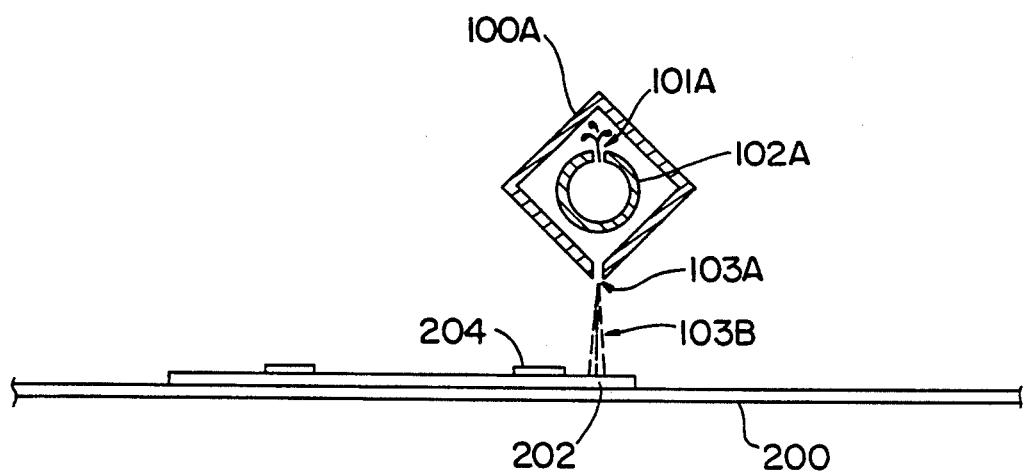
FIG. 5 is a schematic diagrammatic view of an embodiment of the fluid nozzle of the present invention as applied to a hot water wash station.

In the following detailed description of the present invention, various terms such as "components", "leads", "solder", etc., shall have the same meaning as described in more detail in the above mentioned U.S. Pat. Nos. 4410126 and 4401253 and the reference numerals employed in the present invention are the same as those used in FIG. 2 of the earlier U.S. Pat. No. 4410126.

Referring now to FIGS. 1 & 2 of the drawings, the printed circuit board, after passing through standard fluxing and preheating stations, is passed through a mass wave soldering station 36. The components 24 may be mounted on the upper surface of the board with leads protruding downwardly through holes in the board and/or may be secured to the bottom surface of the board (such as by means of an adhesive) with the leads protruding therefrom to contact lands on the board. In both cases the mass soldering station completes the electrical and mechanical connections of the component leads to the board. The mass wave soldering station includes a container of conventional design, indicated generally at 40, for holding a supply of molten solder 42. Conventional heating means (not shown) may be secured to the bottom and/or side walls of container 40 or immersed in the solder to heat and maintain the supply of solder 42 in molten condition.

A sump and nozzle assembly indicated generally at 44 is disposed interiorly of container 40. The sump and nozzle assembly 44 is of conventional design and typically comprises a rounded bottom wall 46, a pair of substantially vertically opposed end walls (not shown) and a pair of inclined side walls 52 and 54. The upper ends of end walls and side walls 52 and 54 are spaced from one another to form a narrow elongated rectangular nozzle or slot 56 which extends above the molten solder level in container 40 for a suitable distance, e.g. one inch above the molten solder level.

Preferably, the sump also includes a pair of adjustable sluice plates 58A, 58B spaced from the sump side walls 52 and 54 for controlling solder overflow from the nozzle 56 e.g. in accordance with the teachings of U.S. Pat. No. 3398873 to Kenneth G. Boynton and Howard W. Wegener. Completing the soldering station is a variable speed pump (not shown) which communicates through an intake orifice 59 in the lower end of the sump and nozzle assembly 44 for pumping solder into the sump where it then rises and overflows the nozzle 56 as a standing solder wave.

An important feature and critical requirement of the present invention is the ability to relocate excess solder on, and/or remove excess solder from the bottom of the circuit board, and from any interconnections, component leads and/or component bodies carried thereon, before the solder can solidify as shorts, icicles and/or bridges. This is accomplished by treating the soldered circuit board and depending components leads at an excess solder removal station 60. Excess solder removal station 60 follows soldering station 36 immediately in line and is designed to relocate or blow off excess solder from the board underside before the solder solidifies as shorts, icicles and/or bridges. Solder removal station 60 comprises a fluid knife indicated generally at 62, from which a heated fluid stream, e.g. hot air, can be directed onto the underside of the board 20. Fluid flow rate, fluid pressure, and fluid temperature and the time elapsed between circuit board emersion from the solder wave and beginning of contact by the fluid stream may vary widely depending on the board temperature, ambient temperature, melting point of the solder, specific heat of the fluid and heat transfer coefficient of fluid to the board, board size and shape, component density, amount of solder deposited and to be removed, conveyor speed, and distance between the soldering station and the excess solder removal station. Preferably apparatus 62 is disposed proximate the path of travel of the boards. Apparatus 62 of course must be spaced sufficiently below the path of travel of the boards to permit clearance of the longest depending lead, etc. Inert gas may be used as the fluid, but preferably the impinging fluid comprises air. The fluid should be pre-heated preferably to a temperature above that of the molten solder in the soldering station (which for standard 63:37 solder is approximately 260° C.) and preferably will be preheated to a temperature in the range of above 280° C. to 400° C., more preferably about 370° C. to 400° C. (measured at the outlet of apparatus 62). For 63/37 solder alloy, the preferred fluid preheat temperature is about 370° C. (which can be measured at the outlet of the slot 103).

Referring now in more detail to FIG. 1 taken in connection with FIGS. 2 and 3, the specific construction of the improved air knife will become apparent. In FIG. 1 the relationship of the air knife 60 to the other elements of the system is illustrated. In FIGS. 2 and 3, which are enlarged sectional views of the air knife, the specific details of construction of the air knife are shown. The air knife 62 comprises an outer square stainless steel tube 100 having an inner hot air distributing tube 102. The hot air from the knife escapes through a slot 103 along that corner of the square tube closest to the emerging solder coated circuit board. Air delivered via a conduit 116 enters the air knife from a hot air source 115 through a tube 108 into the interior of distributing tube 102 out through holes 104 positioned on that surface of the inner tube 102 farthest spaced from the air knife slot 103. Between the inner tube 102 and the outer square tube 100 is positioned at least one screen 106 which serves as a baffle. In the preferred embodiment, two such screens are shown. In FIG. 3, for simplicity of illustration, the screen has been eliminated. In one preferred form of the invention, the square tube 100 is preferably one and one-quarter inch (1¼) square stainless steel tube having 0.120 inch thick walls. The orifice 103 is preferably a 0.020 inch slot, approximately 21 inches long to cover a circuit board 20–21 inches long passing over the air knife.

The slot preferably has a width to length ratio along the air flow of at least 1:5 to provide an adequately narrow jet of hot air. The specific preferred ratio described above is 1:6. The preferred screen is made of 0.0075 inch wire woven in 60 mesh.

In order to compensate for pressure drop within the inner pipe, the effective area of vent holes per length of pipe may be varied. For example, in a preferred embodiment of an eighteen inch wide model, all of the holes are the same size (0.140 inch in diameter) and are spaced apart according to the following table:

TABLE 1

| HOLE NUMBER | SPACING (INCH) |
| --- | --- |
| 1 to 3 | 0.50 |
| 3 to 8 | 0.75 |
| 8 to 12 | 1.00 |
| 12 to 14 | 1.25 |
| 14 to 16 | 1.50 |
| 16 to 17 | 1.80 |

A portion of a pipe having the hole spacing of Table 1 is shown in FIG. 3A.

A similar result can be achieved by decreasing the hole size from entrance end to far end with constant spacing of the holes.

Thus, in another embodiment of the invention, the hot air knife comprises a generally square outer tube having an elongate slot along a corner edge, an interior round hot air delivery pipe inside said square tube, hot air vent holes in said round pipe on a side of said round pipe removed from the slot in the square pipe, said air delivery pipe having an air inlet end, the area of air vent holes per inch of pipe length decreasing (due to smaller hole size) from said inlet end to the termination of said inlet pipe, thereby providing uniform flow of hot air along the slot.

Referring now to FIG. 4, the performance of the improved air knife is compared to a commercially used air knife of somewhat different design, sold by the assignee of the present invention. This commercial design is indicated as the H PAK on FIG. 4 while the present design is identified as the enhanced P#4 air knife. The H PAK design comprises a round tube containing a screen mesh baffle and a 0.020 inch slot, 18 inches long in this constituting the air knife. The hot air is introduced inside of the tubular screen, the screen acting as a distributing baffle. As can be seen the uniformity of distribution of air velocity across the length of the enhanced (P#4) air knife is greatly improved over the prior H PAK air knife.

Various changes may be made in the foregoing invention without departing from the spirit and scope thereof. For example, while the air knife is shown as being stationary, it can, if desired, be subjected to a rocking motion in accordance with the invention described in U.S. Pat. No. 4679720 of July 14, 1987, issued to the assignee of the present invention. If the air knife is rocked in accordance with the teachings of U.S. Pat. No. 4679720, it will have the additional advantage of providing a constantly changing angle of impact of an extremely uniform blast of hot air across the board.

Referring now to FIG. 5, there is shown an embodiment of the invention where the fluid nozzle is utilized as a hot water knife in a cleaning station, particularly for cleaning surface mounted electronic elements which are carried by a printed circuit board. This washing step is necessary to remove any solder flux and other dirt which may remain on the printed circuit board carrying the soldered components. If the boards, as finally delivered from the manufacturing process, are not free of this solder flux, it can have a corrosive affect, over time, which will adversely affect the electrical performance of the final circuit.

In this FIG. 5 embodiment, there is shown a section of a conventional wash system where a conveyor 200 carries a printed circuit board 202 having, on one surface, a surface mounted element 204. In such systems it is necessary to remove essentially all of the solder flux, particularly that which may be situated under the element 204 between the bottom of 204 and the printed circuit board 202. For this purpose, it has been found that the fluid jet of the current invention is particularly useful since it can deliver an extremely high intensity, narrowly focused, hot water stream (with appropriate detergents) to the surface of the printed circuit board where this hot water "knife" can deliver a jet (see 103B of FIG. 5) of high energy water to all openings in the region of the surface mounted element 204 (e.g., spaces under the surface mounted element).

In this embodiment of the invention, a preferred system is described below for a sixteen inch water knife. In this case, the tube 101A is preferably a 1¼ inch square stainless steel tube having 0.12 inch thick walls. The orifice 103A is preferably a 0.020 inch slot approximately 17 inches long to cover a circuit board approximately 16 inches wide. The inner tube 102A is about 0.8 inch outer diameter and the holes 101A are approximately 0.140 inch diameter. As shown, these are spaced about 180° from the slot 103A. In one preferred embodiment the hole spacing, as measured from the far end of the tube (i.e. the closed end of the inner tube), is as follows: 0.69, 2.44, 3.94, 5.44, 6.69, 7.94, 8.94, 9.94, 10.94, 11.94, 12.69, 13.44, 14.19, 14.94, 15.69, 16.19 and 16.69. Thus, it can be seen that, with identical size holes, the holes are much more closely spaced at the entrance end of the pipe and the spacing increases along the pipe.

In FIG. 5 the tube 101A is shown as being positioned above the conveyor 200. Several tubes 101A can also be positioned below the conveyor or both above and below. The water knife of the present invention can be used for all wash and rinse stations.

When a water knife, as described above, was tested against a commercial water jet system, it was found to have substantially improved performance for removing flux from under surface mounted test chips. In these tests the commercial embodiment is shown as a "Perfo Jet" whereas a nozzle of the present invention is identified as "Super Spray". These tests results are enumerated in Tables 2 and 3.

In these tests a standard commercial wash system was modified to include the water knife of the present invention in place of a commercial Jet Spray station. A normal commercial saponifier (e.g., Alpha 2110-10% concentration) was employed with a wash water temperature of 150° F. (rinse 120° F.) and a wash pressure of 80 PSI (rinse 20-40 PSI). A preferred conveyor speed of 2 feet per minute was employed in these tests. The flux involved was a standard flux such as Alpha RA9-LV.

Visual results show the Super Spray with the greatest change in % flux free area at the 0.002 and 0.010 standoff height while the Perfo Jet appears to have the greatest effect at the 0.001' standoff height (see Table 3). Weight change results show that for all three standoff heights the Super Spray had as good, if not a greater, ability to remove flux from under the coupons as that of the Perfo Jet (see Table 4).

TABLE 2

| WASH CONF. | DISTANCE OF ORIFICE TO CONVEYOR | CHANGE IN % FLUX FREE AREA UNDER COUPONS | | |
|---|---|---|---|---|
| | | .001 | .002 | .010 |
| PERFO JET | 5.75" | **8.75 | 3.75 | 29.25 |
| PERFO JET | 3.00" | 0.50 | 5.75 | 26.00 |
| SUPER SPRAY | 3.00" | 4.50 | 11.25 | 37.75 |

**It is possible that the unexpected high % change data at 001 spacing may have been caused by something disrupting the board building process causing the actual standoff height to be greater than .001". This would explain the greater change in % flux free area under the coupon as the cleaning process would have been made easier. From the other data, the expected change in % flux free area under the coupon for the .001" standoff height should be in the area of 0.25 to 1.5 which is again well below that of the Super Spray.

TABLE 3

| WASH CONF. | DISTANCE OF ORIFICE TO CONVEYOR | AVERAGE WEIGHT CHANGE | | |
|---|---|---|---|---|
| | | .001 | .002 | .010 |
| | | (g × 100) | | |
| PERFO JET | 5.75" | 5.5 | 5.0 | 45.0 |
| PERFO JET | 3.00" | 5.5 | 3.5 | 39.5 |
| SUPER SPRAY | 3.00" | 6.5 | 5.0 | 52.0 |

These weight change data are consistent and show the improved performance of the water knife of the present invention.

Still other changes may be made by one skilled in the art. Accordingly, it is intended that all matter contained in the above description or shown in the accompanying drawings shall be interpreted in an illustrative and not in a limiting sense.

We claim:

1. In a wash system for cleaning residual flux from a soldered printed circuit board having surface mounted circuit elements, conveyor means for moving said circuit board past a liquid nozzle for providing a high velocity sheet of liquid of substantially uniform velocity, density and volume extending in a predetermined direction and arranged to impact a circuit board to be treated by said sheet of liquid as said circuit board is moved past said nozzle, said nozzle comprising an outer tube having an elongated slot along one side thereof from which said sheet of fluid is emitted, an inner generally round tube mounted within said outer tube supplying high pressure fluid to said outer tube, said inner tube having an inlet at one end and being closed at the other end, a plurality of fluid vent holes in said inner tube communicating with said outer tube, said vent holes being spaced at least 90° around said inner tube from the position of the slot, the improvement wherein the outer tube is generally square and the elongated slot is along one edge thereof and the vent holes are all of substantially the same size and are positioned more closely together adjacent the inlet end of said inner tube than further along said inner tube.

* * * * *